United States Patent
Tamarapalli et al.

Patent Number: 6,070,261
Date of Patent: *May 30, 2000

[54] MULTI-PHASE TEST POINT INSERTION FOR BUILT-IN SELF TEST OF INTEGRATED CIRCUITS

[75] Inventors: Nagesh Tamarapalli, Tualatin; Janusz Rajski, West Linn, both of Oreg.

[73] Assignee: Mentor Graphics Corporation, Wilsonville, Oreg.

[*] Notice: This patent is subject to a terminal disclaimer.

[21] Appl. No.: 09/024,962

[22] Filed: Feb. 11, 1998

Related U.S. Application Data

[63] Continuation of application No. 08/678,376, Jul. 1, 1996, Pat. No. 5,737,340.

[51] Int. Cl.⁷ .................................................. G01R 31/28
[52] U.S. Cl. .......................................................... 714/733
[58] Field of Search .................................. 714/733, 724, 714/734, 738, 739

[56] References Cited

U.S. PATENT DOCUMENTS

| | | |
|---|---|---|
| 4,701,920 | 10/1987 | Resnick et al. . |
| 4,918,378 | 4/1990 | Katircioglu et al. . |
| 4,949,341 | 8/1990 | Lopez et al. . |
| 5,173,906 | 12/1992 | Dreibelbis et al. . |
| 5,230,000 | 7/1993 | Mozingo et al. . |
| 5,258,985 | 11/1993 | Spence et al. . |
| 5,341,399 | 8/1994 | Eguchi ........................................ 375/10 |
| 5,383,195 | 1/1995 | Spence et al. . |
| 5,414,716 | 5/1995 | Bershteyn . |
| 5,428,625 | 6/1995 | Dekker . |
| 5,737,340 | 4/1998 | Tamarapalli ............................ 371/22.5 |

OTHER PUBLICATIONS

*Test Point Placement to Simplify Fault Detection*; Hayes et al.; IEEE Transactions on Computers, vol. C–23, No. 7, pp. 727–735 (Jul., 1974).

*On Testability Analysis of Combinational Networks*; Franc Brglez; ISCAS '84; pp. 221–225 (1984).

*Statistical Fault Analysis*; Jain et al.; IEEE Design & Test; pp. 38–44 (Feb. 1985).

*Predict—Probabilistic Estimation of Digital Circuit Testability*; Seth et al.; IEEE, pp. 220–225 (1985).

*A Statistical Calculation of Fault Detection Probabilities By Fast Fault Simulation*; Waicukauski et al; 1985 International Test Conference; Paper No. 21.3; pp. 779–784 (1985).

(List continued on next page.)

*Primary Examiner*—Hoa T. Nguyen
*Attorney, Agent, or Firm*—Klarquist Sparkman Campbell Leigh & Whinston, LLP

[57] ABSTRACT

Method and apparatus for providing high quality Built-In-Self-Test (BIST) of integrated circuits, while guaranteeing convergence and reducing area-overhead and power dissipation during test mode. A divide and conquer approach is used to partition the test into multiple phases during which a number of test patterns are applied to a circuit under test (CUT). The design of each phase (the selection of control and observation points) is guided by a progressively reduced list of undetected faults. Within a phase, a set of control points maximally contributing to the fault coverage achieved so far is identified using a unique probabilistic fault simulation (PFS) technique. The PFS technique accurately computes a propagation profile of the circuit and uses it to determine the impact of a new control point in the presence of control points selected so far. In this manner, in each new phase a group of control points, driven by fixed values and operating synergistically, is enabled. Observation points are selected in a similar fashion to further enhance the fault coverage. The sets of control and observation points are then inserted into the circuit under test and a new, reduced list of undetected faults is determined through exact fault simulation. This process is iterative and continues until the number of undetected faults is less than or equal to an acceptable threshold, a pre-specified number of control and observation points have been inserted, or the maximum number of specified test phases has been reached.

19 Claims, 4 Drawing Sheets

OTHER PUBLICATIONS

*Protest: A Tool For Probabilistic Testability Analysis*; Wunderlich; 22nd Design Automation Conference; Paper 14.3; pp. 204–211; (1985).

*Random Pattern Testability by Fast Fault Simulation* Briers et al.; IEEE 1986 International Test Conference; paper 9.5 pp. 274–281 (1986).

*A Dynamic Programming Approach to the Test Point Insertion Problem*; Krishnamurthy; 24th ACM/IEEE Design Automation Conference; Paper 36.3, pp. 695–705 (1987).

*Synthesis of Pseudo–Random Pattern Testable Designs*; Iyengar et al.; 1989 International Test Conference; Paper No. 22.2, pp. 501–508 (1989).

*An Observability Enhancement Approach for Improved Testability and At–Speed Test*; Rudnick et al.; IEEE Transactions on Computer–Aided Design of Integrated Circuits and Systems vol. 13, No. 8, pp. 1051–1056 (Aug. 1994).

*DFTGEN User's Guide*, Digital Equipment Corp., Jul. 1995.

*Timing–Driven Test Point Insertion for Full–Scan and Partial–Scan BIST*; Kwang–Ting (Tim) Cheng et al.; International Test Conference; Paper 23.1: 506–514 (1995).

*Test Point Insertion for Scan–Based BIST*, Bernhard H. Seiss, Pieter M. Trouborst, Michael H. Schulz, Published before Jul. 1, 1996.

MULTI-PHASE TEST POINT INSERTION FOR BUILT-IN SELF TEST OF INTEGRATED CIRCUITS

This application is a continuation of Ser. No. 08/678,376, filed Jul. 1, 1996, now U.S. Pat. No. 5,737,340.

FIELD OF THE INVENTION

This invention relates generally to the testing of circuits for faults. More particularly, this invention relates to a method and apparatus for inserting test points into a circuit under test to improve its testability and to the testable circuit itself.

BACKGROUND OF THE INVENTION

The very large scale integrated (VLSI) circuits fabricated today contain hundreds of thousands of circuit elements. Testing these complex circuits to isolate faulty circuits from fault-free circuits has become increasingly difficult because of the inaccessibility of internal circuit elements and the elements' interdependencies. As the density of these circuits continues to grow, the difficulty of testing them for faults will grow even greater. Furthermore, as these integrated circuits are assembled into printed circuit boards (PCBs) and systems containing several PCBs, it is imperative to reuse the testing effort spent at circuit level to be able to contain the very high costs involved in ensuring the quality of PCBs and systems.

To test a circuit, a set of test vectors, or patterns, must be developed. This is typically done by employing an automatic test pattern generator (ATPG) which, given a circuit and fault model, generates test vectors to detect the faults. This process is accelerated by employing a fault simulator. In this fault simulation technique, the circuit is first simulated without any faults and the test patterns applied to determine the circuits' expected response to the patterns at its primary outputs. The circuit is then simulated with faults and the test patterns again applied to determine if there is a change in the expected response to any pattern. A fault that does not cause a change in the expected (fault free) response is an undetected fault. A test procedure must provide a desired fault coverage, which means that it must detect a certain percentage of faults; undetected faults must be few.

Testing of integrated circuits has traditionally been performed by employing an external testing device that applies the test patterns generated by an ATPG to the primary inputs of the circuit under test. The response of the circuit at its primary outputs to the test vectors is then compared in some manner with the expected response to determine if there are faults within the circuit. This method, however, requires enormous resources to generate and store the test patterns required for complex VLSI circuits.

The built-in-self-test (BIST) scheme offers an attractive alternative to conventional methods of testing. With BIST, the test pattern generation and output response analysis are performed by on-chip circuitry. Such a scheme reduces the external tester costs because of the migration of test generation and response analysis functions onto the chip itself. Moreover, the integration of the designed circuitry and testing circuitry on the chip allows for testing the circuit at its normal operating speed, resulting also in the detection of non-modeled faults. The BIST scheme also provides a hierarchical solution that can easily be utilized at circuit board and system levels.

Different BIST schemes vary in the techniques used for on-chip test pattern generation and output response analysis. Random pattern generation, wherein the individual circuit inputs are assigned a 0 or a 1 with equal probability, is a preferred method because of its simplicity. The test patterns may be generated with a linear feedback shift register (LFSR). On-chip output response analysis is typically performed by multiple-input-shift-register (MISR), a circuit that compacts the output response and generates a signature for comparison with the signature of a fault-free circuit.

Although random pattern generation is simple, the presence of random pattern resistance faults in many practical circuits limits its success. Acceptable test quality for these circuits can only be achieved by applying an inordinate number of random patterns. This elevates the cost of test application and fault simulation beyond acceptable levels. A problem then arises as how to achieve the test quality of an ATPG tool while limiting the test application and fault simulation efforts.

One way of improving random pattern testability is through modification of the circuit under test (CUT). Test points, which include observation and control points, are inserted at selected nodes of the CUT. A control point improves the controllability of a node (i.e., the ability to achieve a particular signal value such as 1 or 0) as well as nodes in its fanout cone. It is typically inserted by adding logic to the circuit. An observation point improves the observability of the node (i.e., the ability to observe the output of an internal node) as well as nodes in its fanin cone it is typically inserted by adding an additional output lead from the node. While observation points always improve fault coverage, control points cause complicated changes in the circuit which may not always improve the fault coverage. Several test point insertion procedures have been proposed in the literature. The underlying philosophy of these procedures is to identify, using either exact fault simulation or approximate testability measures, locations in the CUT to introduce control and observation points. Typically, these procedures suggest that control points in the CUT be driven by independent, equi-probable signals. The test patterns are then applied to the CUT in a single session with all control and observation points enabled.

Most practical circuits require a large number of test points to meet the fault coverage requirement, which is specified as the detection of a percentage of possible faults in the circuit. Selection of these large number of test points using repetitive exact fault simulation is not feasible because of the excessive computation requirement. Approximate testability measures, although they reduce time, ignore correlation between nodes in the CUT. This makes such measures incapable of properly capturing the interaction between control points. Of the $2^K$ possible combinations of values at K equi-probable control points, many combinations may be detrimental because of conflicting values. Since no attempt is made in these measures to consider this destructive correlation during the selection of control points, it is not unusual to obtain reduced fault coverage as increasing numbers of control points are inserted. This results in a divergence of the solution and the selection of futile control points. Furthermore, limiting chip area overhead by sharing of logic driving these control points is not straightforward. Finally, power dissipation during testing tends to be higher than in normal circuit operation because of the presence of the large number of nodes with uniform signal probability.

An objective of the invention, therefore, is to provide a method of identifying test points that achieves higher fault coverage for testing of a circuit with application of a specified number of test patterns. Another objective of the invention is to provide method and apparatus for the built-in self testing of circuits which requires fewer test points to achieve the desired fault coverage.

SUMMARY OF THE INVENTION

In accordance with the invention, an apparatus for built-in self testing of a circuit includes the following elements. A test pattern generator generates test patterns that are applied to inputs of the circuit during a test phase. An output response analyzer analyzes an output response of the circuit to the test patterns to detect a fault within the circuit. A test pattern counter counts the test patterns generated by the test pattern generator. And a phase decoder responds to the test pattern counter by generating a phase signal that controls control points in the circuit during the test phase.

The invention also includes a method of inserting test points such as control points and observation points into a circuit under test. During a first phase, a first set of test patterns is applied to the circuit while simulating faults in the circuit to determine a list of undetected faults. During a second phase, a test point is inserted into the circuit to detect undetected faults on the list. A second set of test patterns is then applied to the circuit with the test point enabled while simulating the undetected faults to determine a reduced list of undetected faults. The reduced list of undetected faults then becomes the list of undetected faults for a following phase.

Inserting an observation point into a circuit is preferably done in the following manner. A propagation profile for the circuit is computed. The internal nodes of the circuit at which the greatest numbers of undetected faults are likely to be observed is determined. One of these internal nodes is then selected and connected outside the circuit so that the undetected faults at the internal node can be observed. The steps of selecting and connecting are repeated for additional internal nodes until given criteria are no longer met.

Inserting a control point into a circuit is preferably done in the following manner. A propagation profile for the circuit is computed. From the propagation profile a list of candidate nodes for control point insertion is determined. For each candidate node, a control point is temporarily inserted at the node and the propagation profile is recomputed. Based on the recomputed propagation profile, a control point is then selected and inserted into the circuit. In the present embodiment, the control point that produces a greatest number of faults that propagate to observable circuit locations is selected. These steps are repeated for inserting additional control points until given criteria are no longer met.

In determining which test points to insert into a circuit, a novel method for probabilistic fault simulation of the circuit is used. The method comprises the following steps. The operation of the circuit is simulated and the signal probabilities for nodes within the circuit are determined. The nodes comprise logic gates such as AND, OR and Inverter gates. A list of faults associated with each node along with associated detection probabilities are then computed using the signal probabilities and the logic function of the node. This information is referred to as the propagation profile of the circuit.

The foregoing and other objects, features, and advantages of the invention will become more apparent from the following detailed description of a preferred embodiment which is described with reference to the accompanying drawings.

DETAILED DESCRIPTION OF A PREFERRED EMBODIMENT

Figure 1:
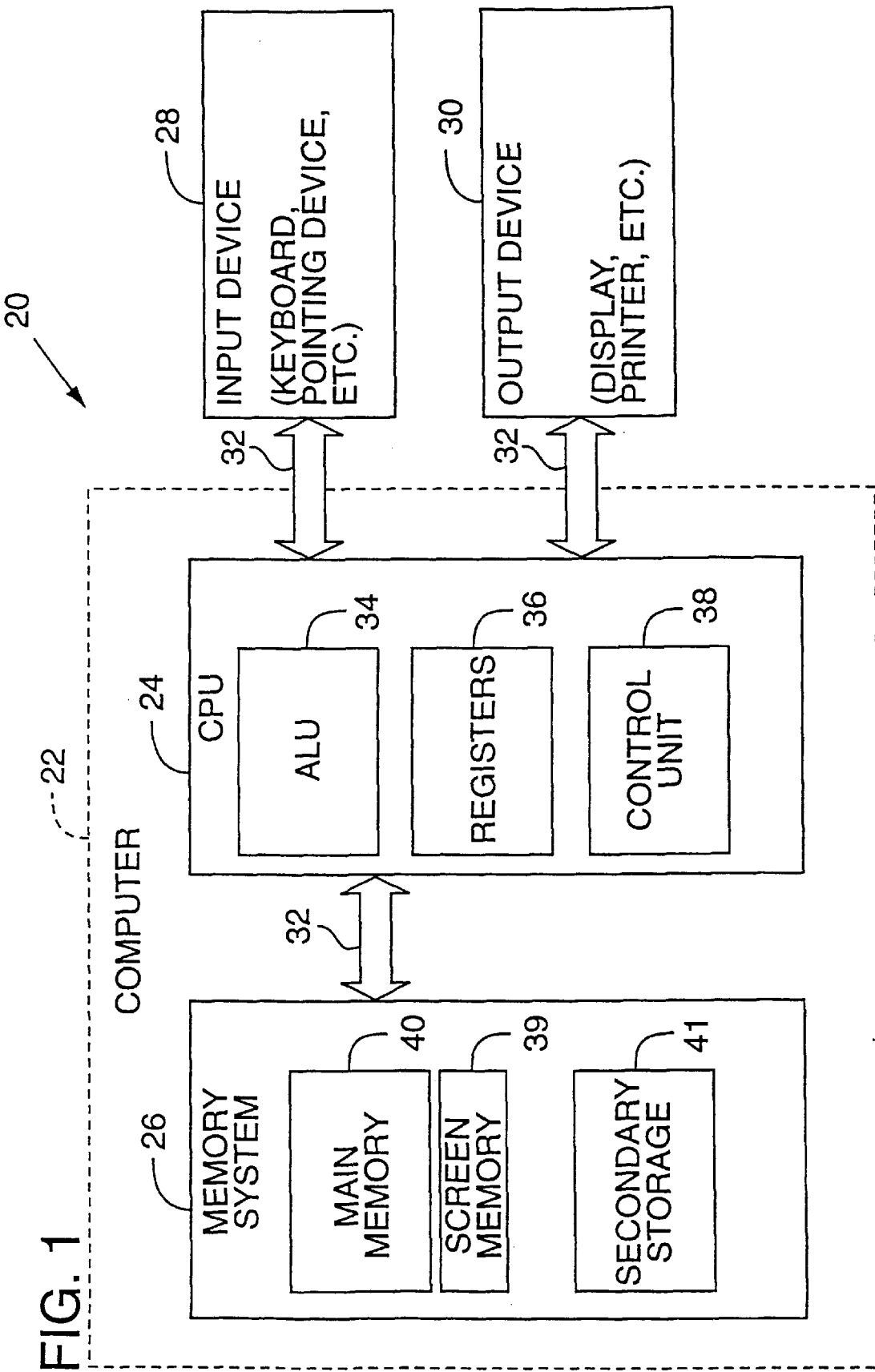
FIG. 1 is a block diagram of a computer system that may be used to implement a method and apparatus embodying the invention.

Referring to FIG. 1, an operating environment for an illustrated embodiment of the present invention is a computer system 20 with a computer 22 that comprises at least one high speed processing unit (CPU) 24, in conjunction with a memory system 26, an input device 28, and an output device 30. These elements are interconnected by at least one bus structure 32. Multiprocessor systems can also be used.

The illustrated CPU 24 is of familiar design and includes an ALU 34 for performing computations, a collection of registers 36 for temporary storage of data and instructions, and a control unit 38 for controlling operation of the system 20. The CPU 24 may be a processor having any of a variety of architectures now known or contemplated in the art.

The memory system 26 generally includes high-speed main memory 40 in the form of a medium such as random access memory (RAM) and read only memory (ROM) semiconductor devices, and secondary storage 41 in the form of long-term storage mediums such as floppy disks, hard disks, tape, CD-ROM, flash memory, etc. and other devices that store data using electrical, magnetic, optical or other recording media. The main memory 40 also can include video display, or screen, memory 39 for displaying images through a display device. Those skilled in the art will recognize that the memory 26 can comprise a variety of alternative components having a variety of storage capacities.

The input and output devices 28, 30 also are familiar. The input device 28 can comprise a keyboard, a mouse, a physical transducer (e.g., a microphone), etc. The output device 30 can comprise a display, a printer, a transducer (e.g., a speaker), etc. Some devices, such as a network interface or a modem, can be used as input and/or output devices.

As is known to those skilled in the art, the computer system 20 further includes an operating system and at least one application program. The operating system is the set of software which controls the computer system's operation and the allocation of resources. The application program is the set of software that performs a task desired by the user, using computer resources made available through the operating system. Both are resident in the illustrated memory system 26.

In accordance with the practices of persons skilled in the art of computer programming, the invention is described below with reference to acts and symbolic representations of operations that are performed by computer system 20, unless indicated otherwise. Such acts and operations are referred to as being computer-executed or computer-implemented. It will be appreciated that the acts and symbolically represented operations include the manipulation by the CPU 24 of electrical signals representing data bits. This manipulation causes a resulting transformation or reduction of the electrical signal representation of data bits at memory locations in memory system 26 to thereby reconfigure or otherwise alter the computer system's operation, as well as other processing of signals. The memory locations where data bits are maintained are physical locations that have particular electrical, magnetic, or optical properties corresponding to the data bits.

Figure 2:
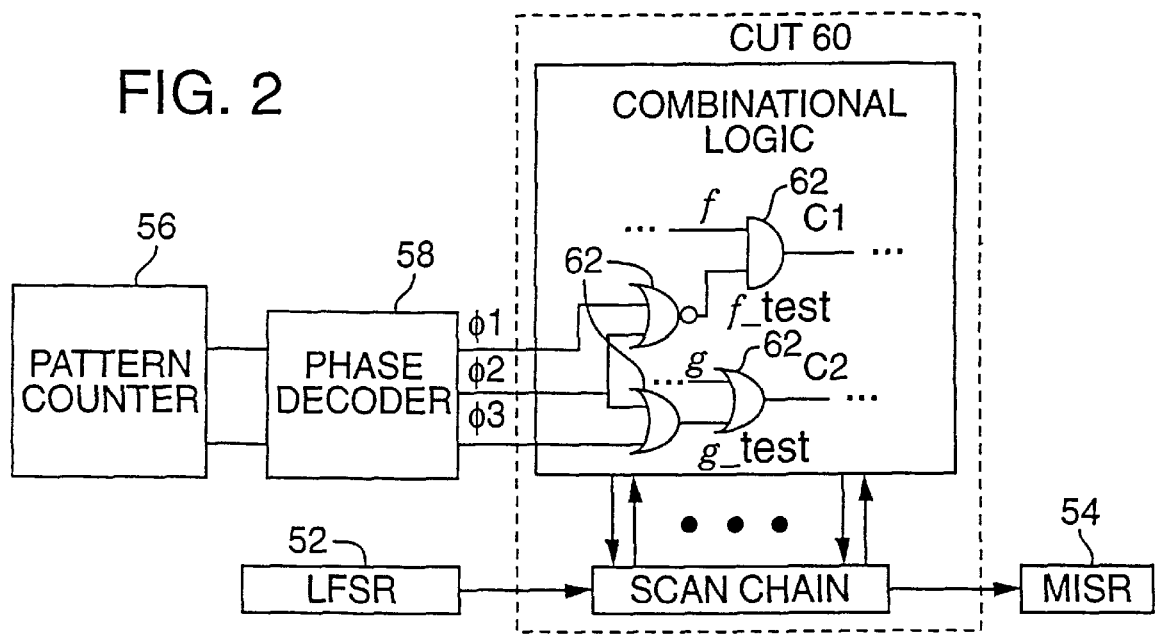
FIG. 2 is a block diagram of a circuit incorporating the BIST scheme in accordance with the invention.

FIG. 2 is a block diagram of a circuit incorporating the BIST scheme in accordance with the invention. The apparatus includes a test pattern generator 52; an output analyzer 54; a test pattern counter 56; and a phase decoder 58. The test pattern generator 52 (such as an LFSR providing patterns to a scan chain) generates predetermined test patterns that are applied to the individual inputs of a circuit under test (CUT) 60. The output response analyzer 54 (such as an MISR and related circuitry) analyzes the response of the circuit 60 to the test patterns for detecting faults within the circuit. The test patterns are counted by the test pattern counter 56. The phase decoder 58 responds to specified counts of the counter by generating a phase signal at its output during each phase which is applied to control points C1 and C2 within circuit 60. These control points are circuit nodes such as test logic 62 which are inserted into the circuit 60 and connected to the output of phase decoder 58. The phase signals are of a fixed value during their respective test phases, $\Phi 0-\Phi 3$, and control the control points C1 and C2, driving them to 0 or 1 as determined by the test logic 62. During each test phase a given number of test patterns is applied to the inputs of circuit 60. These test patterns are preferably different sets. For the apparatus of FIG. 2, for example, there may be 1000 test patterns, with 250 applied in each test phase. The phase decoder 58 may then be constructed to respond to counts 250, 500 and 750 to generate its different phase signals. Given a number of test phases N, the phase decoder 58 can be synthesized with the number of outputs ranging from $[\log_2 N]$ to (N−1) based on the constraints on routing and area-overhead.

Figure 3:
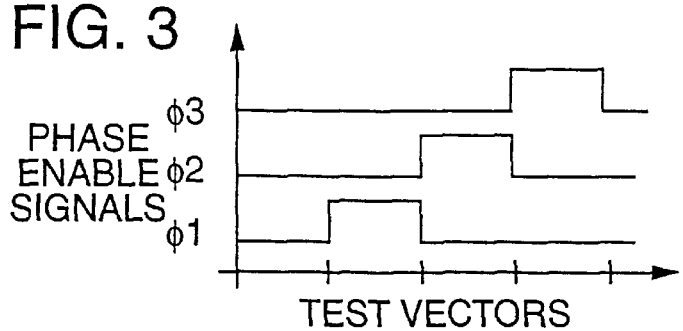
FIG. 3 is a timing diagram of the output signals of the phase decoder in FIG. 2.

The number of test phases may vary depending upon a number of factors. For the example apparatus of FIG. 2, the entire test is divided into four phases, $\Phi 0-\Phi 3$. In the first phase, $\Phi 0$, none of the control points is enabled. FIG. 3 is a timing diagram that shows how the next three phase signals, $\Phi 1-\Phi 3$, are applied in non-overlapping fashion to logic 62 to selectively enable the control points. Each phase thus enables a specific set of control points, facilitating detection of a specific set of faults and contributing to the fault coverage obtained so far. Preferably, each control point is disabled in at least one phase.

C1 and C2 illustrate the implementation of an AND and an OR type control point respectively; other types of control points may, of course, also be implemented. An AND type control point is realized at a node f by ANDing f with the test signal f_test. The test signal is obtained by NORing the enable signals of the phases during which the control point is intended to be active, phases $\Phi 1$ and $\Phi 2$ in the case of C1. Similarly, an OR type control point is implemented by ORing the signal g with the test signal g_test. The test signal g_test is obtained by ORing the enable signals of the phases during which the control point is intended to be active, phases $\Phi 2$ and $\Phi 3$ in the case of C2.

Table 1 lists the output values of C1 and C2 for phases $\Phi 0-\Phi 3$.

TABLE 1

|  | C1 | C2 |
| --- | --- | --- |
| $\Phi 0$ | f | g |
| $\Phi 1$ | 0 | g |
| $\Phi 2$ | 0 | 1 |
| $\Phi 3$ | f | 1 |

The value of f_test is zero during phases $\Phi 1$ and $\Phi 2$, forcing the control point C1 to be zero irrespective of the value of f. However, during phases $\Phi 0$ and $\Phi 3$, f_test's value is one and the normal signal f is passed to C1. Similarly, g_test's value is one during phases $\Phi 2$ and $\Phi 3$ forcing the output of C2, regardless of g's value, to one. During $\Phi 0$ and $\Phi 1$, g_test is zero, allowing the normal signal g to reach the output of C2.

Control points that are enabled in the same phase share the phase signal corresponding to that phase. This is illustrated in FIG. 2 by the sharing of the $\Phi 2$ output of phase decoder between control points C1 and C2.

Figure 4:
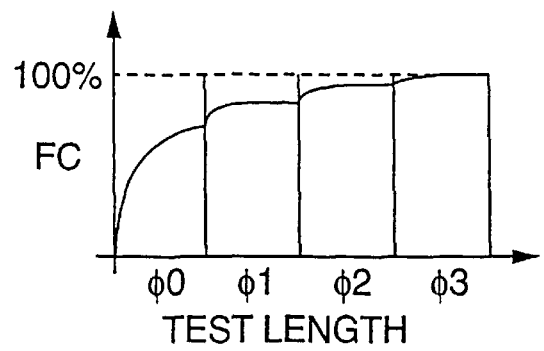
FIG. 4 is a graph of fault coverage as a function of test phases.

By dividing the test into phases and enabling different test points in each phases, a higher fault coverage is achieved. FIG. 4 is a graph of fault coverage as a function of test length (measured by number of test patterns applied). The graph shows how each phase contributes toward complete fault coverage. Within each phase, a set of control points maximally contributing to the fault coverage achieved so far is identified using a probabilistic fault simulation technique, to be described. This technique accurately computes the impact of a new control point in the presence of control points selected so far. In this manner, in each phase a group of control points, driven by fixed values and operating synergistically, is enabled. Additionally, observation points are selected to further increase fault coverage. The result is that each test phase increases the fault coverage significantly above the plateau reached by the previous phase.

Figure 5:
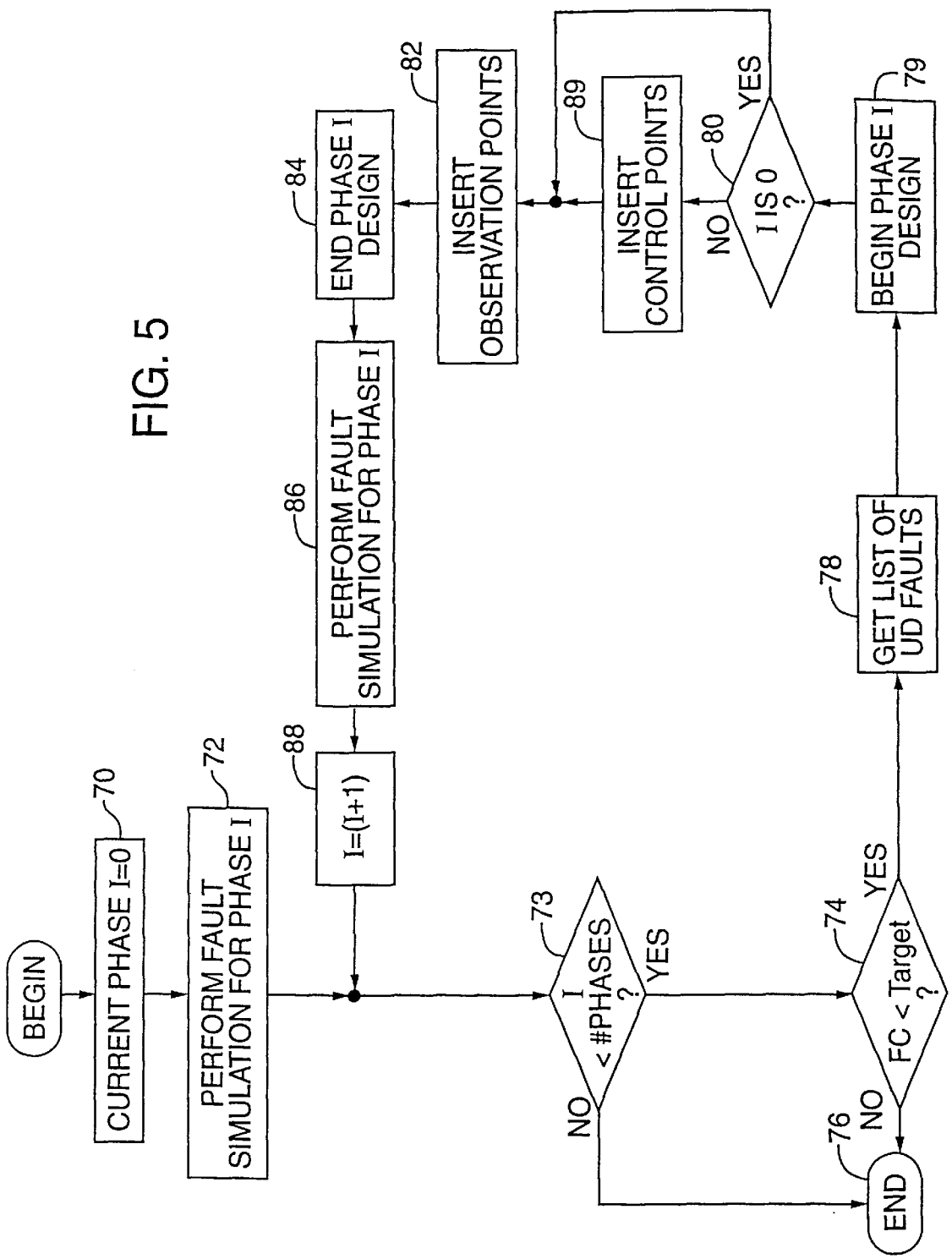
FIG. 5 is a flowchart of a method for inserting control and observation points into a circuit in accordance with the invention.

FIG. 5 is a flowchart of a method for inserting control and observation points into a circuit under test in accordance with the invention. These steps may be carried out by a testing tool that is resident in computer system 20 and may be implemented in software, hardware, or a combination of both. Before beginning the insertion method, however, a benchmark signature for the circuit under test is established by applying a number of test patterns to a logic simulation of the circuit to obtain the expected (fault free) response. The test patterns are then divided into sets corresponding to test phases. In an initial test phase (step 70), all of the possible faults in the circuit are simulated while a first set of test patterns is applied to the fault simulation (step 72). Assuming that the initial phase is a permitted phase (step 73), the fault coverage provided by the test patterns is compared to a target coverage (step 74). If the coverage meets or exceeds the coverage target, then the method concludes (step 76). If not, then a list of the faults undetected by this set of test patterns is obtained for the purpose of determining what test points to insert and where to insert them into the circuit (step 78).

Design of the test phase then begins (step 79). It is next determined if the test phase is the initial phase (step 80). This determination is made because it is preferable to insert observation points, rather than control points, in the initial phase to detect previously undetected faults. An observation point is implemented at an internal circuit node by means of an additional lead, or fanout, from that node that permits the state of signals on the node to be observed elsewhere.

Observation points require fewer changes to the circuit under test and have less interaction with the circuit elements. Thus in the first phase of the preferred embodiment only observation points are inserted to reduce the number of undetected faults (step 82). However, inserting only observation points in the initial phase is a preferred approach but not necessary; the method of the invention could be practiced without it. Observation points are enabled for the entire duration of the test, throughout all phases. Insertion of test points ends the design of a test phase (step 84).

The circuit, with the test points and undetected faults inserted, is then again fault simulated (step 86). In the case of the first phase, the same set of test vectors is applied to the circuit with observation points inserted. The phase number is incremented (step 88) and again checked to determine if the maximum number of phases has been reached (step 73). The fault coverage is again checked (step 74), and if does not meet the target a reduced list of undetected faults is obtained for further test point insertion (step 78).

The design of a next phase then begins (steps 79, 80). First, control points are inserted to further reduce the already-reduced list of undetected faults (step 89). Then observation points are inserted (step 82). The circuit is again simulated with a set of test patterns and the fault coverage checked to determine if the target coverage is reached.

The method continues with additional test phases until the target fault coverage is reached or the specified number of test phases is completed.

In the test phases, control and observation points are inserted iteratively by assessing their impact on the fault coverage. The consequences of inserting a control or observation point at a circuit node are determined by means of a technique called probabilistic fault simulation (PFS). The PFS technique computes for each node in the circuit a list of faults that propagate to that node along with each fault's associated detection probability. This detection probability information, referred to as the propagation profile, along with a detection threshold DTh, guides the selection of control and observation points. The value of the detection threshold is determined by considering factors like the phase duration and the desired detection confidence. The detection threshold can be varied across different test phases.

The key to inserting test points (observation points and control points) is probabilistic fault simulation. Its objective is to compute the propagation profile of the circuit. Since this information is utilized in the iterative test point selection, a fast and accurate technique is necessary for its computation.

Several techniques have been proposed to compute detection probabilities, defined as the probability that a fault f is detected at some primary output by a random test pattern. However, none of these techniques are directly applicable for reliably estimating the detection probability of undetected faults at various nodes in the circuit. Prior probabilistic techniques either completely ignore the reconvergence effects and suffer from consequent inaccuracies or attempt to consider them and experience exponential complexity. The statistical calculation of detection probabilities, although it gives accurate results, cannot be used for iterative control or observation point insertion because such calculation requires too much computation time.

The present method for propagation profile computation is based on a combination of fault-free simulation and analytical fault propagation. First, fault-free simulation is performed for a pre-specified number of random test patterns to obtain signal probabilities necessary for the subsequent fault propagation step. For every node (gate) in the circuit under test, input pattern counts are updated during fault-free simulation. Multiple input gates may be factorized into equivalent 2-input gates to reduce memory requirements. The advantage of relying on simulation to obtain probabilities is its natural ability to capture correlation. Second, the probability of detecting a fault f at a node is computed by propagating the fault forward using analytical equations described below. During forward propagation, information is maintained about the polarity of propagation; i.e., D/$\tilde{D}$. Hence, the probability of detecting a fault at a node is obtained by adding two components, the probability of detecting it as a D and a $\tilde{D}$ at that node. This reflects the scenario in a circuit where a fault can propagate to a node as a D or a $\tilde{D}$ due to the presence of reconvergent fanouts. In addition, the polarity information is helpful in properly capturing the reconvergence of fault effects.

The goal thus is to determine the probability of detecting a fault f as a D and a $\tilde{D}$ at a gate output, given the respective probabilities at the inputs of the gate. The formulae used for detection probability computation for a 2-input AND gate, a 2-input OR gate and an inverter are given in Table 2. From these formulae, computing the detection probability for other logic gates can be easily derived.

The notation used in the formulae is as follows: $P_{xy}$, where $xy \in \{00, 01, 10, 11\}$ denotes the probability of occurrence of a pattern xy at the inputs a and b in the fault-free circuit. Let $n_g/n_f$, where $n_g, n_f \in \{0,1\}$, for a node (i.e., input) $n \in \{a, b, c\}$ denote its values in the fault-free and the faulty circuits respectively. $P_D^n (P_{\tilde{D}}^n)$, where D=1/0 ($\tilde{D}$=0/1), denotes the probability of occurrence of a value D ($\tilde{D}$) at node n. $P_1^n$ ($P_0^n$) denotes the probability of obtaining a value 1 (0) at node $n \in \{a, b, c\}$ in the fault-free circuit. Notice that $P_1^n$, usually referred to as the signal probability of node n, is equal to $(P_{1/1}^n + P_{1/0}^n)$. The signal probabilities of nodes a, b can also be computed from pattern probabilities as $P_1^a = P_{10} + P_{11}$, $P_1^b = P_{01} + P_{11}$. For node c, the signal probability can be obtained from an appropriate pattern probability, based on the function of the gate.

TABLE 2

AND Gate: a, b are inputs, c is the output $$P_1^a = P_{10} + P_{11};\ P_1^b = P_{01} + P_{11}$$

$$P_D^c = \frac{P_{11}}{P_1^a P_1^b}[P_D^a P_D^b + P_1^a P_D^b - P_D^a P_D^b]$$

$$P_{\tilde{D}}^c = \frac{P_{01}}{P_0^a P_1^b} P_D^a [P_1^b - P_D^b] + \frac{P_{10}}{P_1^a P_0^b}[P_1^a - P_D^a] P_D^b + \frac{P_{00}}{P_0^a P_0^b} P_D^a P_D^b$$

OR Gate: a, b are inputs, c is the output $$P_0^a = P_{00} + P_{01};\ P_0^b = P_{00} + P_{10}$$

$$P_D^c = \frac{P_{01}}{P_0^a P_1^b}[P_0^a - P_{DB}^a] P_D^b + \frac{P_{10}}{P_1^a P_0^b} P_D^a [P_0^b - P_{DB}^b] + \frac{P_{11}}{P_1^a P_1^b} P_D^a P_D^b$$

$$P_{\tilde{D}}^c = \frac{P_{00}}{P_0^a P_0^b}[P_{\tilde{D}}^a P_0^b + P_0^a P_{\tilde{D}}^b - P_{\tilde{D}}^a P_{\tilde{D}}^b]$$

TABLE 2-continued

Inverter: a is the input, b is the output $$P_D^b = P_{\bar{D}}^a$$

$$P_{\bar{D}}^b = P_D^a$$

The probability of detecting a fault f at its origin is equal to its excitation probability, which is the probability of obtaining an opposite value for a stack-at fault. The detection probabilities for the set of undetected faults is thus initialized to their respective excitation probabilities. Forward propagation of these faults is then performed utilizing the above equations, preferably in a levelized, event-driven fashion. For each gate, the list of faults at its output is computed from the corresponding list of faults at its inputs. In order to reduce the memory requirement, only faults that are detected with a probability greater than a certain minimum threshold are inserted into the list. This list computation is performed until all events subside or the primary circuit outputs are reached.

The memory requirement as well as the accuracy of the probabilistic fault simulation can be further improved by adopting a two-level method of detection probability computation. In this technique, first all undetected faults are propagated up to the output of their corresponding fanout-free region. Surrogate faults are then associated with active stems; i.e., stems corresponding to the outputs of fanout-free regions with non-empty fault list. Observability of these active stems at various nodes in the circuit is computed through forward propagation of the associated surrogate faults. Hence, the list at a node may now be composed of two kinds of faults, surrogate faults and faults within the local fanout-free region. The complete list of faults at a node is then obtained by appropriately expanding the surrogate faults.

Figure 6:
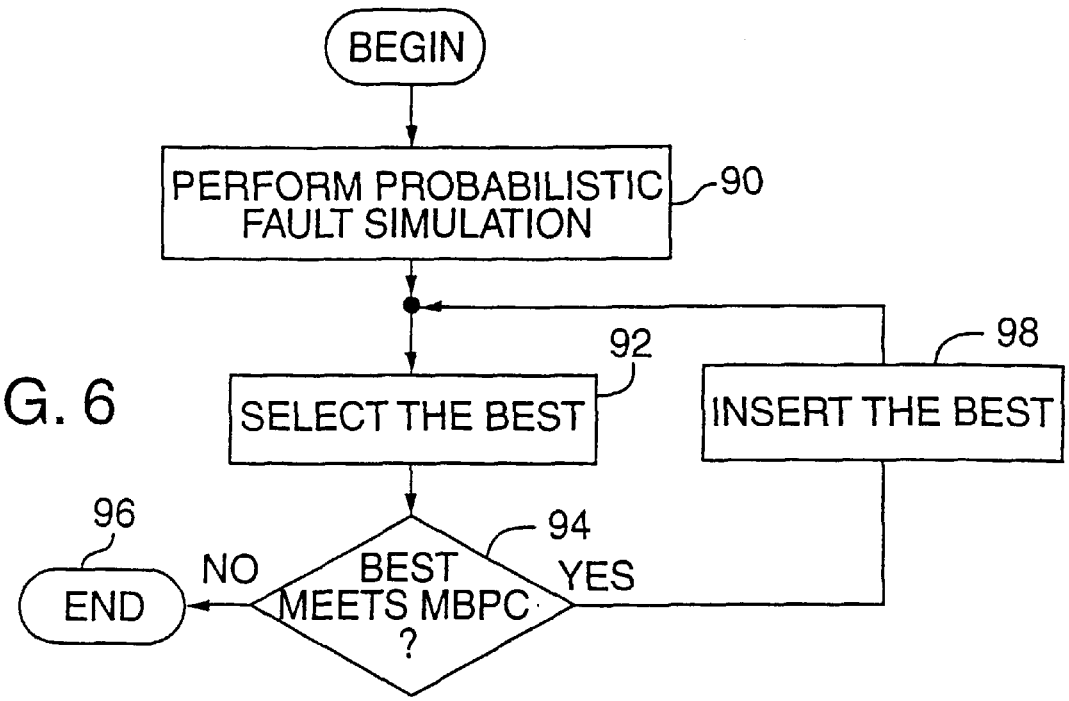
FIG. 6 is a flowchart of a preferred way for inserting observation points.

FIG. 6 is a flowchart of a preferred way for carrying out the step of inserting observation points into the CUT. First, probabilistic fault simulation is performed to obtain the propagation profile information (step 90). The "best" observation point is then selected. In the preferred embodiment, the best observation point is the node at which the greatest number of undetected faults is seen with at least a minimum detection probability DTh (step 92). Other "best" criteria may, of course, be used. To justify implementation of the observation point within the circuit, it is determined if the observation point to be inserted meets a given criteria such as user-specified minimum-benefit-per-cost (MBPC) (step 94). The MBPC quantifies the costs and benefits associated with inserting an observation point into the circuit. If not, the observation point is not added and the insertion step concludes (step 96). If so, the observation point is inserted (step 98). Additional observation points, in the order of those revealing the most still-undetected faults, are then inserted in the same manner until the cost of inserting an additional observation point does not meet the MBPC, or the maximum allowable number of observation points has been inserted.

Stated more formally, the selection of circuit nodes for insertion of observation points is a multi-step process. Probabilistic fault simulation is performed to determine the propagation profiles of the undetected faults. A list of nodes to which faults propagate, with probability greater than certain minimum threshold, is collected. This information is represented internally as a sparse, two-dimensional matrix $T_{M \times N}$, with the collected nodes as rows, undetected faults as columns, and the probability of detecting a fault j, at a node i as entry T[i,j]. To reduce the memory requirement, nodes that carry less than a minimum number of faults, as determined by the minimum-benefit-per-cost criterion, are eliminated. The problem of selecting a pre-specified number of observation points now becomes equivalent to that of selecting the set of rows which maximizes the number of columns satisfying the detection threshold DTh. Since this problem is NP-complete, a greedy heuristic selection method, outlined in the following, is utilized.

The following terms are defined for the explanation of selection process. Let $R=\{r_1, r_2, \ldots, r_m\}$ denote the set of m rows selected so far. The partial covering of a column j, $PC_j$ is defined as $$PC_j = \sum_{i=1 \text{ to } m} T[r_i, j]$$

where $r_i \in R$. The partial covering of a column j represents approximate cumulative detection probability of the corresponding fault at nodes corresponding to the selected rows. A row i is said to cover a column j if $PC_j < DTh$ and $PC_j + T[i,j] \geq DTh$. Finally, let $W_i$, i=1 to M, denote the weight of a row i, which is defined as $$\sum_{j=1 \text{ to } N} \max(0, \min((DTh - PC_j), T[i, j])).$$

The partial cover of all columns is initialized to zero and the selection of rows is performed iteratively, in a greedy fashion. At each iteration a row that covers a maximum number of columns is selected. When multiple rows covering the same maximum number of columns are present, their weights are used to select one among them. Subsequently, partial cover of the affected columns is updated to reflect the recent selection. This selection process continues until a pre-specified number of observation points are selected or no observation point meets the minimum-benefit-per-cost criterion.

Following the completion of the selection process, an improvement of the set of selected rows is performed. Since the selection of a row at iteration I does not consider the effect of the rows selected in subsequent iterations, the final number of columns covered by such a row could be less than the number of columns covered by it at the point of selection. Hence, the selected row that covers the least number of columns at the end of selection process is returned and the partial cover of affected columns is changed accordingly. The best unselected row is then determined. The returned selected row is replaced by the best unselected row, if it covers less of columns than the latter.

Figure 7:
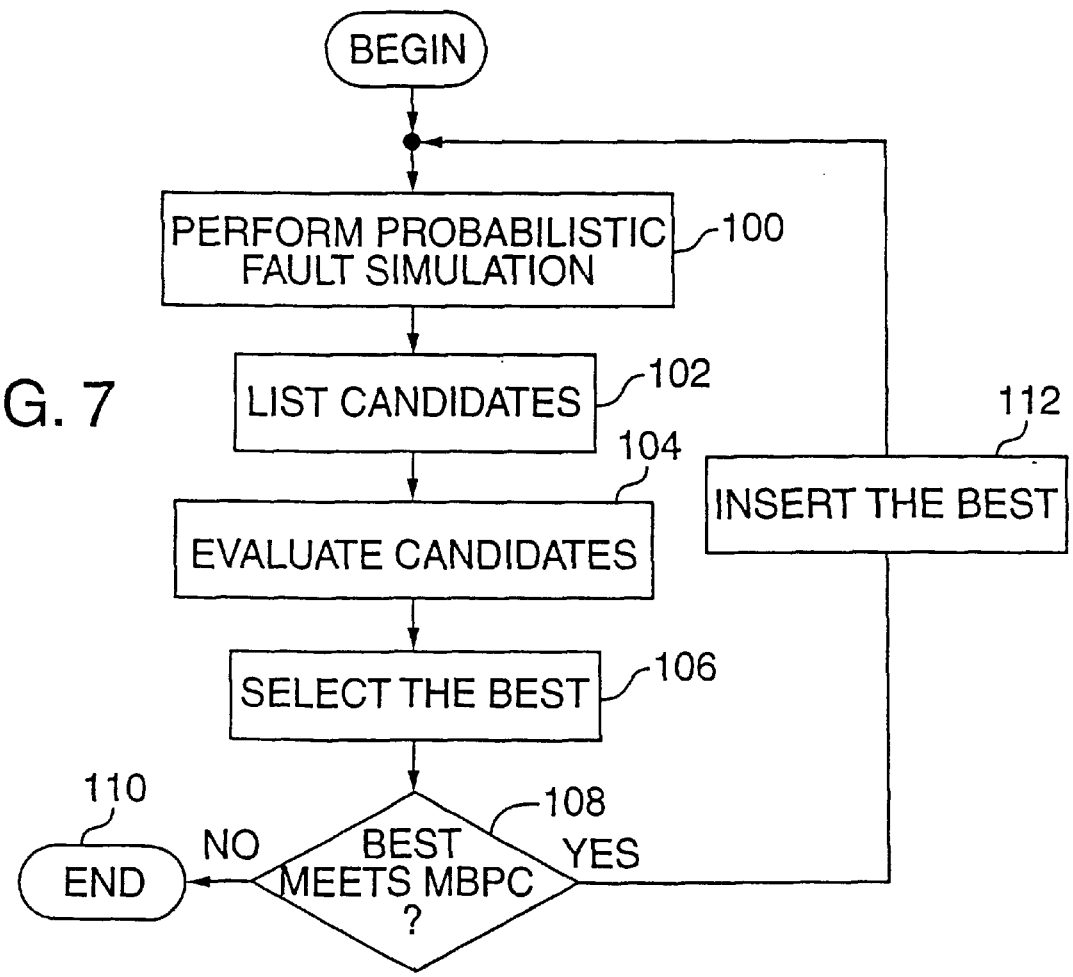
FIG. 7 is a flowchart of a preferred way for inserting control points.

FIG. 7 is a flowchart of a preferred way for carrying out the step of inserting control points into the CUT. Control points are driven by fixed values and are aimed at improving the excitation and propagation of specific faults.

In a first step, probabilistic fault simulation is performed to determine the propagation profile of the circuit (step 100).

Next, a list of candidate locations for control point insertion is determined from the propagation profile such as through an estimation procedure (step 102). Since the processing time required to insert a control point depends significantly on the number of candidates, the objective of this step is to reduce this number without overlooking good candidates. In the preferred embodiment this step computes two measures, $E_0$ and $E_1$, for nodes in the circuit. These measures estimate the number of faults that could potentially be detected by placing an AND- or OR-type control point at a node. The nodes with at least a threshold number of faults are then selected as candidates.

The computation of $E_0$ and $E_1$ is driven by three user-specified parameters: a minimum probability threshold MPTh; a low threshold LTh; and a high threshold HTh. MPTh specifies the minimum acceptable value for 0(1) probability at a node in the circuit. A node for which 0-probability (1-probability) falls below MPTh is called a 0-failing (1-failing) node. The parameters LTh and HTh are used to record the changes in the excitation and propagation probabilities of faults due to the insertion of a control point at a node. A fault for which the excitation probability changes from a value below LTh before the insertion of a control point to a value above HTh after the insertion is considered to be detected by the estimation procedure. Similarly, a fault for which the single level propagation probability changes from a value below LTh before the insertion of a control point to a value above HTh after the insertion is considered to be detected.

The estimation procedure computes $E_0$ and $E_1$ for 0-failing (1-failing) nodes in the circuit in the following way. For each 0-failing (1-failing) node, a constant 0-value (1-value) is injected as a signal probability change at that node. The potential number of faults that could be detected is then determined by computing the consequent signal probability changes and the impact on the excitation and propagation of faults based on the specified thresholds LTh and HTh. This computation is preferably performed in a levelized, event-driven fashion. At each level, signal probability changes are computed using the equations of Table 3. The notation used in this table is as follows: $P_{xy}$ ($P_{xy}^*$) where $xy \in \{00, 01, 10, 11\}$ denotes the probability of occurrence of a pattern xy at the inputs a and b of a 2-input in the circuit without (with) control point. $\Delta_{xy}^+$ ($\Delta_{xy}^-$) denotes the increase (decrease) in the probability of occurrence of a pattern xy. Let $n_0$, where $n_0 \in \{0,1\}$, denote the value of an input $n \in \{a,b\}$ in the original circuit without the control point. Similarly, let $n_m$, where $n_m \in \{0,1\}$, denote the value of an input n in the modified circuit with the control point. $\delta_n^+$ ($\delta_n^-$), denotes $P(n_m=1|n_0=0)$ ($P(n_m=0|n_0=1)$), the probability that a 0 (1) on input n in the original circuit changes to a 1 (0) in the modified circuit. Finally, let $rs \rightarrow xy$, where $rs,xy \in \{00,01,10,11\}$, denote the event of a pattern rs at the inputs a and b in the original circuit without the control point changing to a pattern xy in the circuit with the control point.

TABLE 3

$P^*_{xy} = P_{xy} + \Delta_{xy}^+ - \Delta_{xy}^-$; $xy \in \{00, 01, 10, 11\}$

| Pattern 00 | $\Delta_{00}^- = P_{00} (\delta_a^+ + \delta_b^+ - \delta_a^+\delta_b^+)$ |
| --- | --- |
| | $\Delta_{00}^+ = P_{01} (1 - \delta_a^+) \delta_b^- + P_{10}\delta_a^- (1 - \delta_b^+) + P_{11}\delta_a^-\delta_b^-$ |
| Pattern 01 | $\Delta_{01}^- = P_{01} (\delta_a^+ + \delta_b^- - \delta_a^+\delta_b^-)$ |
| | $\Delta_{01}^+ = P_{00} (1 - \delta_a^+) \delta_b^+ + P_{10}\delta_a^-\delta_b^+ + P_{11}\delta_a^- (1 - \delta_b^-)$ |
| Pattern 10 | $\Delta_{10}^- = P_{10} (\delta_a^- + \delta_b^+ - \delta_a^-\delta_b^+)$ |
| | $\Delta_{10}^+ = P_{00}\delta_a^+ (1 - \delta_b^+) + P_{01}\delta_a^+\delta_b^- + P_{11} (1 - \delta_a^-)\delta_b^-$ |
| Pattern 11 | $\Delta_{11}^- = P_{11} (\delta_a^- + \delta_b^- - \delta_a^-\delta_b^-)$ |
| | $\Delta_{11}^+ = P_{00}\delta_a^+\delta_b^+ + P_{01}\delta_a^+ (1 - \delta_b^-) + P_{10} (1 - \delta_a^-)\delta_b^+$ |

The rationale for the computation of estimates is as follows. The nodes that are suitable for a control point are those that have an extreme probability of 0 or 1. In general, such extreme probability propagates through several levels of a circuit, rendering portions of the circuit non-switching. Such non-switching signals affect both the excitation and propagation probabilities of faults. Hence the estimation procedure fixes a failing node to a particular value and estimates the consequent impact on the excitation and propagation of faults. Any fault for which either the excitation or the single level propagation probability has improved according to the specified thresholds is considered detected. This procedure thus gives an indication of the number of faults that would be detected if a node is to be fixed at either 0 or 1. The estimation procedure thus quickly eliminates a vast majority of nodes from being considered by a subsequent rigorous evaluation step.

A more refined evaluation of the candidate signals is then performed (step 104). For each candidate node, a value (0 or 1, depending upon its $E_0$ and $E_1$ estimates) is temporarily injected and the resulting change in the propagation profile of the circuit is recomputed in the following manner.

The insertion of a control point at a node perturbs its signal probability as well as that of nodes in its fanout. This perturbation in the signal probabilities causes a change in the propagation profile. A two-step method that determines changes in the signal probability followed by changes in the propagation profile is used.

To determine the modified signal probabilities of the circuit, the control point is simulated by injecting a signal probability change at the control point location. The change is injected as an increment or a decrement depending on whether an AND or an OR type control point is being simulated. Analytical techniques are then used to determine the resulting changes in the pattern probabilities at inputs of the gates in the fanout cone of the control point. Notice that pattern probabilities offer complete information and are used to compute the modified signal probabilities.

The task thus consists of analytically computing the change in the pattern probabilities at a gate, given the changes in the signal probabilities of its inputs. Starting from the control point location, the probability changes are computed with the equations given in Table 3. For each gate that is affected, its modified pattern probabilities are computed and a new signal probability is obtained from appropriate pattern probabilities. Fanouts of the affected gates are scheduled for evaluation only if the new signal probability deviates from the original signal probability by more than a pre-specified threshold.

Once the modifications in signal probabilities are determined, the next step is to compute the change in the propagation profile. Since placement of a control point at a node only affects the list of faults associated with the node or other nodes in the node's fanout cone, it is necessary to recalculate the propagation profile for only this set of nodes. An incremental probabilistic fault simulation, using modified signal probabilities, is performed to determine the new list of faults at various nodes in the fanout cone of the candidate signal.

In evaluating the candidate nodes, candidates are ranked by the number of new faults that propagate to observable circuit locations such as primary circuit outputs or observation points.

Based on the recomputed propagation profile, a "best" control point is selected (step 106). In the preferred embodiment, the candidate with highest rank is selected for control point insertion. The cost of the selected candidate is compared to a given criteria such as the MBPC (step 108). If the candidate does not meet the MBPC, then the control point is not inserted and the insertion step ends (step 110). If the candidate meets the MBPC, then the control point is inserted (step 112). The insertion step then repeats until the cost of an additional control point exceeds the benefit of inserting it into the circuit. During iterations through the insertion step, control points previously inserted during the phase are enabled so that their presence has an impact on the selection of further control points.

The method of test point insertion is demonstrated by the following example, where a tool made in accordance with the invention is used on several benchmark circuits.

For each benchmark circuit, test point insertion is performed with a pre-specified number of control and observation points. The objective of the test point insertion is to achieve complete or near complete fault coverage with 32000 random patterns, and minimum number of test phases.

Before proceeding with the insertion of test points, the number of phases N, and the design parameters of each phase, i.e., the duration and the number of control and observation points in each phase, have to be determined. In the example embodiment, N is chosen to be an arbitrary value, and the number of test patterns is evenly distributed along the entire test length among these phases. Fault any modifications are given under the column Original-Circuit, while those of the 2-phase experiment are given under the column 2-phase. To reduce any random effect, the average and maximum fault coverage of ten fault simulation experiments are presented. In addition, for the 2-phase experiment the number of control and observation points inserted in each circuit are reported.

The results for the 2-phase experiment are significant. For all of the circuits, an average fault coverage of greater than 99% is achieved with the insertion of very few test points. For circuits c2670, s3330 and s3384 complete coverage of stuck-at faults is obtained. This is especially significant considering the simplicity of control point implementation in the 2-phase scheme. All the control points are essentially disabled during $\Phi 0$ and enabled during $\Phi 1$ by a single phase decoder output.

TABLE 4

| Circuit Name | Original-Circuit (32k random patterns) | | 2-phase (32k random patterns) | | | multi-phase (32k random patterns) | | | |
|---|---|---|---|---|---|---|---|---|---|
| | Average FC | Max. FC | #Cps/ #Ops | Average FC | Max. FC | #Phases | #Cps/ #Ops | Average FC | Max. FC |
| c2670 | 88.12 | 88.82 | 1/5 | 100.0 | 100.0 | — | — | — | — |
| c7552 | 96.73 | 97.06 | 18/2 | 99.49 | 99.60 | 6 | 18/2 | 100.0 | 100.0 |
| s3330 | 87.95 | 88.99 | 1/4 | 99.97 | 100.0 | — | — | — | — |
| s3384 | 96.06 | 96.30 | 0/5 | 100.0 | 100.0 | — | — | — | — |
| s4863 | 97.66 | 98.12 | 6/4 | 99.78 | 99.83 | 4 | 6/4 | 99.96 | 100.0 |
| s9234 | 93.13 | 93.79 | 8/10 | 99.80 | 99.85 | 3 | 8/10 | 99.97 | 100.0 |
| s15850 | 95.72 | 95.99 | 15/17 | 99.16 | 99.21 | 4 | 15/17 | 99.67 | 99.71 |
| s38417 | 95.40 | 95.64 | 18/30 | 99.79 | 99.82 | 3 | 18/30 | 99.81 | 99.85 | simulation for phase $\Phi 0$ is then performed using a fast fault simulator. The set of undetected faults at the end of $\Phi 0$ is then used to insert observation points. No control points are inserted during $\Phi 0$ in order to preserve the initial fault coverage. The design of each of the subsequent phases $\Phi 1$ to $\Phi(N-1)$ is then carried out iteratively. In each phase a fixed number of control points targeting the set of undetected faults inherited from the previous phase, have been inserted with the knowledge of already inserted test points. All observation points are inserted during $\Phi 0$ and the total number of control points are distributed equally among the phases $\Phi 1$ to $\Phi(N-1)$.

The selection of test points within a particular phase is controlled by a set of parameters such as the detection probability threshold DTh, the minimum-benefit-per-cost MBPC, and the implementation cost factors of control and observation points. The cost factors reflect the relative complexity of implementing a particular type of test point and provide the user with a means to obtain a solution with the preferred type of test points. A detection probability threshold of $4/D_{\Phi I}$ is used where $D_{\Phi I}$ is the duration of phase $\Phi I$, and a minimum-benefit-per-cost of 10. In addition, the cost of realizing a control point is assumed to be one unit, and that of an observation point to be 0.5. When multiple test phases are used, it is possible to re-enable a control point in phases subsequent to the phase in which it is selected. A cost factor of 0.25 is assigned for the re-enabled control points.

Since the objective is to obtain complete or near complete fault coverage with a minimum number of phases, a 2-phase experiment is first performed for all the circuits. Table 4 presents the results obtained for this experiment. In this table, fault simulation results of the original circuit without For circuits for which complete coverage is not achieved with the 2-phase scheme, multiphase schemes with more than two phases are conducted. The results of these schemes are also presented in Table 4 under the column multi-phase, where the number of phases are reported in addition to the number of control and observation points, average and maximum fault coverage of ten fault simulation trails.

The following observations can be made from the multi-phase results. First, the number of phases that are necessary to achieve complete or near complete fault coverage is small. In fact for the circuit c7552, the number of different combinations that occur at the 18 control points is only 6, compared to the maximum possible $2^{18}$ combinations when equi-probable values are used. Second, the insertion of a few control or observation points leads to complete or near complete fault coverage. This follows from the fact that conflicting control points are enabled in different phases, reducing the number of futile control points selected.

Having illustrated and described the principles of the invention in a preferred embodiment, it should be apparent to those skilled in the art that the preferred embodiment can be modified in arrangement and detail without departing from such principles. For example, many of the software aspects of the embodiment may be implemented in hardware and many of the hardware aspects may be implemented in software. In view of the many possible embodiments to which the principles of the invention may be applied, it should be recognized that the illustrated embodiment is only a preferred example of the invention and should not be taken as a limitation on the scope of the following claims. We claim as the invention all that comes within the scope of these claims.

What is claimed is:

1. Apparatus for built-in self testing of a circuit comprising:
   a test pattern generator for generating test patterns that are applied to inputs of the circuit;
   a test pattern counter for counting the test patterns generated by the test pattern generator; and
   a phase decoder responsive to the test pattern counter for generating a signal that controls control points in the circuit.

2. The apparatus of claim 1 wherein the phase decoder is responsive to the test pattern counter by generating signals in response to test pattern counts.

3. The apparatus of claim 1 wherein a control point comprises a node within the circuit under test.

4. The apparatus of claim 3 wherein the node comprises a logic gate.

5. The apparatus of claim 1 including an observation point within the circuit under test.

6. The apparatus of claim 5 wherein the observation point comprises an output lead.

7. A computer-readable medium on which is stored a computer program for building into a circuit under design the following:
   a test pattern generator for generating test patterns that are applied to inputs of the circuit;
   a test pattern counter for counting the test patterns generated by the test pattern generator; and
   a phase decoder responsive to the test pattern counter for generating a phase signal that controls control points in the circuit.

8. A method of testing a circuit comprising:
   generating test patterns that are applied to inputs of the circuit;
   counting the test patterns generated by the test pattern generator; and
   in response to the count, generating a signal that controls control points in the circuit.

9. A circuit for executing the steps of claim 8.

10. A method of inserting test points into a circuit for built-in self testing of the circuit, the method comprising the following steps:
    applying a first set of test patterns to the circuit while simulating faults in the circuit to determine a list of undetected faults;
    inserting a test point into the circuit to detect undetected faults on the list; and
    applying a second set of test patterns to the circuit with the test point enabled while simulating the undetected faults to determine a reduced list of undetected faults.

11. The method of claim 10 wherein the reduced list of undetected faults becomes the list of undetected faults for a following application of the method.

12. The method of claim 10 wherein the test point is an observation point, and the step of inserting the observation point includes the following steps:
    determining internal nodes of the circuit at which the greatest numbers of undetected faults are likely to be observed;
    selecting one of the internal nodes; and
    connecting the selected internal node outside the circuit.

13. The method of claim 12 wherein the steps of selecting and connecting are repeated for additional internal nodes.

14. The method of claim 12 wherein the determining step comprises computing a propagation profile for the circuit.

15. The method of claim 10 wherein the test point is a control point having a fixed value.

16. The method of claim 10 including inserting a test point before applying a first set of test patterns to the circuit.

17. A computer readable medium on which is stored instructions for executing the steps of claim 10.

18. The method of claim 10 wherein the test point is a control point, and the step of inserting the control point includes the following steps:
    computing a propagation profile for the circuit;
    determining from the propagation profile a list of candidate nodes for control point insertion;
    for a candidate node, temporarily inserting a control point at the node and recomputing the propagation profile; and
    based on the recomputed propagation profile, selecting a control point and inserting the point into the circuit.

19. A method for performing probabilistic fault simulation of a circuit, the method comprising the following steps:
    simulating in a computer the operation of a circuit;
    determining signal probabilities for nodes within the circuit; and
    computing detection probabilities for a fault at a node to which the fault propagates using at least the signal probabilities of the node.

* * * * *